(12) United States Patent
Terasaki et al.

(10) Patent No.: US 10,798,824 B2
(45) Date of Patent: Oct. 6, 2020

(54) METHOD FOR MANUFACTURING INSULATED CIRCUIT BOARD, INSULATED CIRCUIT BOARD, AND THERMOELECTRIC CONVERSION MODULE

(71) Applicant: MITSUBISHI MATERIALS CORPORATION, Tokyo (JP)

(72) Inventors: Nobuyuki Terasaki, Saitama (JP); Toyo Ohashi, Saitama (JP)

(73) Assignee: MITSUBISHI MATERIALS CORPORATION, Tokyo (JP)

( * ) Notice: Subject to any disclaimer, the term of this patent is extended or adjusted under 35 U.S.C. 154(b) by 0 days.

(21) Appl. No.: 16/306,708

(22) PCT Filed: Jun. 23, 2017

(86) PCT No.: PCT/JP2017/023272
§ 371 (c)(1),
(2) Date: Dec. 3, 2018

(87) PCT Pub. No.: WO2017/222061
PCT Pub. Date: Dec. 28, 2017

(65) Prior Publication Data
US 2019/0132956 A1  May 2, 2019

(30) Foreign Application Priority Data

Jun. 23, 2016 (JP) ................................ 2016-124667
Jun. 21, 2017 (JP) ................................ 2017-121741

(51) Int. Cl.
*H05K 3/06* (2006.01)
*H05K 3/00* (2006.01)
(Continued)

(52) U.S. Cl.
CPC ........... *H05K 3/0017* (2013.01); *H01L 23/12* (2013.01); *H01L 23/3735* (2013.01);
(Continued)

(58) Field of Classification Search
CPC .............. H05K 3/0017; H05K 3/0055; H05K 2201/10219; H05K 1/181; H05K 1/0306;
(Continued)

(56) References Cited

U.S. PATENT DOCUMENTS 4,296,309 A * 10/1981 Shinmi .................. H01C 7/006
                                                              219/543
4,434,544 A *  3/1984 Dohya .................. H01L 27/016
                                                              148/277

(Continued)

FOREIGN PATENT DOCUMENTS

JP       07-142858 A    6/1995
JP       3171234 B2     5/2001
(Continued)

OTHER PUBLICATIONS

International Search Report dated Aug. 29, 2017, issued for PCT/JP2017/023272 and English translation thereof.
(Continued)

*Primary Examiner* — Peter Dungba Vo
*Assistant Examiner* — Kaying Kue
(74) *Attorney, Agent, or Firm* — Locke Lord LLP

(57) ABSTRACT

The method for manufacturing an insulated circuit board of the present invention includes: a ceramic/aluminum-joining step of joining an aluminum material to a ceramic substrate and thereby, forming an aluminum layer; a titanium material-disposing step of disposing a titanium material on a surface of the aluminum layer or the aluminum material in a circuit pattern shape; a titanium layer-forming step of performing a heat treatment in a state where the titanium material is laminated on the surface of the aluminum layer or the aluminum material and thereby, forming the titanium
(Continued)

layer; and an etching treatment step of etching the aluminum layer on which the titanium layer is formed, into the circuit pattern shape.

15 Claims, 9 Drawing Sheets

(51) Int. Cl.
    *H01L 35/08* (2006.01)
    *H01L 23/498* (2006.01)
    *H01L 23/373* (2006.01)
    *H01L 23/12* (2006.01)
    *H05K 1/03* (2006.01)
    *H05K 1/18* (2006.01)
    *H01L 23/00* (2006.01)

(52) U.S. Cl.
    CPC ........ *H01L 23/49866* (2013.01); *H01L 35/08* (2013.01); *H05K 1/0306* (2013.01); *H05K 1/181* (2013.01); *H05K 3/0055* (2013.01); *H01L 24/29* (2013.01); *H01L 24/32* (2013.01); *H01L 24/83* (2013.01); *H01L 2224/29111* (2013.01); *H01L 2224/32225* (2013.01); *H01L 2224/83447* (2013.01); *H01L 2924/10253* (2013.01); *H01L 2924/3512* (2013.01); *H05K 2201/10219* (2013.01)

(58) Field of Classification Search
    CPC ............... H01L 35/08; H01L 23/49866; H01L 23/3735; H01L 23/12; H01L 24/32; H01L 24/29; Y10T 29/49155; Y10T 29/49124; Y10T 29/49117
    USPC .................................. 29/847, 846, 829, 825
    See application file for complete search history.

(56) References Cited

U.S. PATENT DOCUMENTS

| | | | | |
|---|---|---|---|---|
| 4,496,435 A * | 1/1985 | Harada | .................. | H01L 21/707 205/125 |
| 5,116,463 A * | 5/1992 | Lin | ..................... | H01L 21/4846 216/18 |
| 5,354,415 A * | 10/1994 | Fushii | ....................... | H05K 3/06 216/108 |
| 6,369,410 B1 * | 4/2002 | Yamazaki | ............. | H01L 29/458 257/412 |
| 6,370,768 B1 * | 4/2002 | Itabashi | ................. | H05K 3/422 29/852 |
| 7,263,766 B2 * | 9/2007 | Ishiwata | ................ | H01L 23/34 174/258 |
| 9,082,776 B2 * | 7/2015 | Lu | ......................... | H01L 23/293 |
| 9,793,409 B2 * | 10/2017 | Kao | ....................... | H01L 29/786 |
| 2003/0041452 A1 * | 3/2003 | Sinha | ................... | H01L 45/1658 29/852 |
| 2004/0016570 A1 * | 1/2004 | Yamamoto | ............. | H05K 1/114 174/261 |
| 2004/0083590 A1 * | 5/2004 | Lee | ......................... | H03H 3/08 29/25.35 |
| 2004/0262367 A1 * | 12/2004 | Nakamura | ............ | C04B 37/026 228/122.1 |
| 2006/0046512 A1 * | 3/2006 | Nakamura | ........ | H01L 29/66757 438/770 |
| 2007/0210350 A1 * | 9/2007 | Omura | ................. | H01L 29/0696 257/287 |
| 2008/0001290 A1 * | 1/2008 | Chou | ....................... | H01L 24/03 257/751 |
| 2008/0029294 A1 * | 2/2008 | Kawamura | ............ | H05K 3/386 174/261 |
| 2010/0025676 A1 * | 2/2010 | Yamazaki | ......... | H01L 29/42384 257/43 |
| 2010/0301329 A1 * | 12/2010 | Asano | ............... | H01L 29/42384 257/43 |
| 2011/0068335 A1 * | 3/2011 | Yamazaki | ................ | H01L 29/04 257/43 |
| 2011/0114480 A1 * | 5/2011 | Yamazaki | ........... | H01L 27/1225 204/298.13 |
| 2011/0266558 A1 * | 11/2011 | Yano | ..................... | H01L 29/861 257/77 |
| 2013/0256014 A1 * | 10/2013 | Takahashi | ............... | H05K 1/092 174/257 |
| 2014/0339288 A1 * | 11/2014 | Otaki | ..................... | C04B 37/021 228/117 |
| 2016/0035660 A1 * | 2/2016 | Terasaki | ............... | B23K 35/005 174/252 |
| 2016/0120017 A1 * | 4/2016 | Momoi | ................... | B32B 15/08 361/720 |
| 2016/0192503 A1 * | 6/2016 | Chiwata | .................. | C04B 41/91 29/847 |
| 2016/0284862 A1 * | 9/2016 | Yamazaki | ............. | H01L 29/045 |
| 2017/0154855 A1 | 6/2017 | Oi et al. | | |
| 2018/0086625 A1 * | 3/2018 | Kub | ....................... | B81B 7/0019 |

FOREIGN PATENT DOCUMENTS

| | | |
|---|---|---|
| JP | 2003-078086 A | 3/2003 |
| JP | 2003-309294 A | 10/2003 |
| JP | 2004-172378 A | 6/2004 |
| JP | 2008-208442 A | 9/2008 |
| JP | 2012-248697 A | 12/2012 |
| JP | 2015-070063 A | 4/2015 |
| JP | 5725060 B2 | 5/2015 |
| JP | 2015-233063 A | 12/2015 |
| TW | I478295 B | 3/2015 |
| WO | 2016/002803 A1 | 1/2016 |

OTHER PUBLICATIONS

Supplementary European Search Report dated Jan. 30, 2020, issued for European Patent Application No. 17815526.3.
Office Action dated Apr. 7, 2020, issued for the Taiwanese patent application No. 106121338 and an English translation of the Search Report.

\* cited by examiner

US 10,798,824 B2

METHOD FOR MANUFACTURING INSULATED CIRCUIT BOARD, INSULATED CIRCUIT BOARD, AND THERMOELECTRIC CONVERSION MODULE

TECHNICAL FIELD

The invention relates to a method for manufacturing an insulated circuit board including a ceramic substrate and a circuit layer having a circuit pattern disposed on one surface of the ceramic substrate, an insulated circuit board, and a thermoelectric conversion module.

The present application claims priority on Japanese Patent Application No. 2016-124667 filed on Jun. 23, 2016, and Japanese Patent Application No. 2017-121741 filed on Jun. 21, 2017, the contents of which are incorporated herein by reference.

BACKGROUND ART

A semiconductor device such as an LED and a power module or a thermoelectric conversion module has a structure in which a semiconductor element or a thermoelectric element is joined onto a circuit layer consisting of a conductive material.

A power semiconductor element for high-power control used for controlling wind power generation, an electric vehicle, a hybrid vehicle, and the like has a large amount of heat generation. Therefore, as a board on which this is mounted, an insulated circuit board has been hitherto widely used, and the insulated circuit board includes: a ceramic substrate consisting of, for example, AlN (aluminum nitride), $Al_2O_3$ (alumina) or the like; and a circuit layer formed by joining a metal sheet having excellent conductivity to one surface of the ceramic substrate. As the insulated circuit board, one having a metal layer formed on the other surface of the ceramic substrate is also provided.

For example, a power module described in Patent Document 1 has a structure including an insulated circuit board in which a circuit layer and a metal layer consisting of Al are respectively formed on one surface and the other surface of a ceramic substrate, and a semiconductor element joined onto the circuit layer via a solder material.

In addition, the power module has a configuration in which a heat sink is joined to the other surface side of the insulated circuit board so that heat transferred from the semiconductor element to the insulated circuit board side is dissipated to the outside via the heat sink.

However, as in the power module described in Patent Document 1, in the case where the circuit layer and the metal layer consist of Al, an oxide film of Al is formed on the surface. Therefore, depending on the solder material, the semiconductor element or the heat sink cannot be directly joined.

In the related art, for example, as disclosed in Patent Document 2, a Ni plating film is formed on the surface of a circuit layer and a metal layer by electroless plating or the like, and thereafter, a semiconductor element or a heat sink is soldered (solder joint).

In addition, Patent Document 3 proposes a technique for joining a semiconductor element to a circuit layer, and joining a heat sink to a metal layer using a silver oxide paste containing silver oxide particles and a reducing agent consisting of an organic material, as an alternative to a solder material.

However, as described in Patent Document 2, in an insulated circuit board in which the Ni plating film is formed on the surface of the circuit layer and the surface of the metal layer, the surface of the Ni plating film deteriorates due to oxidation and the like in the course of joining the semiconductor element and the heat sink, so that there is a concern that the reliability of joining the semiconductor element and the heat sink joined via the solder material may decrease. In addition, in a Ni plating step, a masking treatment may be performed so as to prevent a problem such as electrolytic corrosion due to Ni plating formed in an unnecessary region. In the case where the plating treatment is performed after the masking treatment as described above, a great effort is needed for the step of forming the Ni plating film on the surface of the circuit layer and the surface of the metal layer, and there is a problem in that the manufacturing cost of the power module greatly increases.

Furthermore, as described in Patent Document 3, in the case where the semiconductor element is joined to the circuit layer using the silver oxide paste and the heat sink is joined to the metal layer using the silver oxide paste, the joining property between the Al and a sintered body of the silver oxide paste is poor; and therefore, there is a need to previously form an Ag underlayer on the surface of the circuit layer and the surface of the metal layer.

Patent Document 4 proposes an insulated circuit board in which a circuit layer has a laminated structure of an aluminum layer and a metal member layer consisting of copper, nickel, or silver. The insulated circuit board has a structure in which the aluminum layer and the metal member layer are joined via a titanium layer.

Furthermore, in a thermoelectric conversion module, in the case where a circuit layer consists of aluminum or the like, there is a concern that aluminum may diffuse to a thermoelectric element and the characteristics of the thermoelectric element may deteriorate. Therefore, in order to prevent aluminum from diffusing to the thermoelectric element, formation of a titanium layer as a diffusion prevention layer on the surface of the circuit layer has been considered.

PRIOR ART DOCUMENTS

Patent Documents

Patent Document 1: Japanese Patent No. 3171234
Patent Document 2: Japanese Unexamined Patent Application, First Publication No. 2004-172378
Patent Document 3: Japanese Unexamined Patent Application, First Publication No. 2008-208442
Patent Document 4: Japanese Patent No. 5725060

DISCLOSURE OF THE INVENTION

Problems to be Solved by the Invention

However, in the insulated circuit board described in Patent Document 4 or in an insulated circuit board in which a titanium layer is formed on the surface of a circuit layer, an etching treatment may be performed to form a circuit pattern in the circuit layer.

As an etchant used for performing the etching treatment on copper or aluminum, for example, ferric chloride is used. However, since the titanium layer cannot be etched by the etchant mentioned above, there is a problem in that the circuit pattern cannot be formed by performing the etching treatment on the circuit layer having the titanium layer.

The invention has been made taking the foregoing circumstances into consideration, and an object thereof is to provide a method for manufacturing an insulated circuit board capable of accurately and efficiently forming a circuit pattern in a circuit layer including an aluminum layer disposed on one surface of a ceramic substrate and a titanium layer formed on a surface of the aluminum layer on a side opposite to the ceramic substrate, an insulated circuit board, and a thermoelectric conversion module.

Solutions for Solving the Problems

In order to solve the above-described problems, a method for manufacturing an insulated circuit board of the present invention is a method for manufacturing an insulated circuit board including a ceramic substrate and a circuit layer having a circuit pattern disposed on one surface of the ceramic substrate, in which the circuit layer includes an aluminum layer disposed on the one surface of the ceramic substrate, and a titanium layer formed on a surface of the aluminum layer on a side opposite to the ceramic substrate. The method includes: a ceramic/aluminum-joining step of joining an aluminum material to the ceramic substrate and thereby, forming the aluminum layer; a titanium material-disposing step of disposing a titanium material, which is to become the titanium layer, on a surface of the aluminum layer or the aluminum material in the circuit pattern shape; a titanium layer-forming step of performing a heat treatment in a state where the titanium material is laminated on the surface of the aluminum layer or the aluminum material and thereby, forming the titanium layer; and an etching treatment step of etching the aluminum layer on which the titanium layer is formed, into the circuit pattern shape.

With the method for manufacturing an insulated circuit board having the above-described configuration, since the titanium material-disposing step and the titanium layer-forming step are provided, the titanium layer can be formed on the surface of the aluminum layer in the circuit pattern shape.

In addition, since the etching treatment step of performing the etching treatment on the aluminum layer on which the titanium layer is formed in the circuit pattern shape is provided, the titanium layer acts as a resist material and the aluminum layer can be etched into the circuit pattern shape.

As described above, by using the titanium layer as the resist material, an applying step, a curing step, and a peeling step of a resist material can be omitted, and the etching treatment step can be efficiently performed.

Accordingly, the circuit pattern can be accurately and efficiently formed in the circuit layer including the aluminum layer disposed on one surface of the ceramic substrate and the titanium layer formed on the surface of the aluminum layer on the side opposite to the ceramic substrate.

In the method for manufacturing an insulated circuit board of the present invention, the circuit layer may include a metal member layer consisting of copper, nickel, or silver laminated on a surface of the titanium layer on a side opposite to the aluminum layer, and the method may further include a metal member layer-forming step of forming the metal member layer on the surface of the titanium layer formed into the circuit pattern shape after the etching treatment step.

In the present invention, the metal member layer consists of copper, a copper alloy, nickel, a nickel alloy, silver, or a silver alloy.

In this case, since the metal member layer-forming step of forming the metal member layer on the titanium layer formed in the circuit pattern shape is provided, the metal member layer consisting of copper, nickel, or silver can be formed on the titanium layer.

Accordingly, in the circuit layer including the aluminum layer disposed on the one surface of the ceramic substrate and the metal member layer consisting of copper, nickel, or silver laminated on the surface of the aluminum layer on the side opposite to the ceramic substrate via the titanium layer, the circuit pattern can be accurately and efficiently formed.

In addition, it is preferable that the method for manufacturing an insulated circuit board of the present invention further include: a titanium layer-cleaning step of cleaning the surface of the titanium layer before the metal member layer-forming step.

In this case, by cleaning the surface of the titanium layer, the metal member layer can be reliably formed on the titanium layer.

Furthermore, in the method for manufacturing an insulated circuit board of the present invention, the titanium material-disposing step and the titanium layer-forming step may be performed after the ceramic/aluminum-joining step.

In this case, after the aluminum layer is formed by joining the ceramic substrate and an aluminum sheet together, the titanium layer can be formed on the aluminum layer in the circuit pattern.

In addition, in the method for manufacturing an insulated circuit board of the present invention, the ceramic/aluminum-joining step may be performed after the titanium layer-forming step.

In this case, the aluminum sheet and the ceramic substrate can be joined together after the titanium layer is formed on the aluminum sheet in the circuit pattern shape.

Furthermore, in the method for manufacturing an insulated circuit board of the present invention, the titanium layer-forming step and the ceramic/aluminum-joining step may be simultaneously performed.

In this case, by simultaneously performing the titanium layer-forming step and the ceramic/aluminum-joining step, the insulated circuit board having the circuit pattern shape can be efficiently manufactured.

In addition, it is preferable that the method for manufacturing an insulated circuit board of the present invention further include: an aluminum-cleaning step of cleaning the surface of the aluminum layer or the aluminum material before the titanium material-disposing step.

In this case, by cleaning the surface of the aluminum layer or the aluminum material, the titanium material can be reliably joined to the aluminum layer or the aluminum material; and thereby, the titanium layer can be formed.

In addition, it is preferable that the method for manufacturing an insulated circuit board of the present invention further include: a Si-enriched layer-forming step of forming a Si-enriched layer containing Si in an amount of 0.03 mass % or more and 1.0 mass % or less on the surface of the aluminum layer or the aluminum material on which the titanium layer is to be formed, before the titanium material-disposing step.

In this case, by forming the Si-enriched layer described above on the surface of the aluminum layer or the aluminum material on the side where the titanium layer is to be formed, Si can be solid-solubilized in (solid-soluted into) $Al_3Ti$ at the interface between the titanium layer and the aluminum layer, so that the formation of hard $Al_3Ti$ in an excessive amount can be prevented, and the occurrence of cracks at the joint interface between the titanium layer and the aluminum layer can be prevented.

An insulated circuit board of the present invention is an insulated circuit board including: a ceramic substrate; and a circuit layer having a circuit pattern disposed on one surface of the ceramic substrate, in which the circuit layer includes an aluminum layer disposed on the one surface of the ceramic substrate, and a titanium layer formed on a surface of the aluminum layer on a side opposite to the ceramic substrate.

In the insulated circuit board having the above-described configuration, since the titanium layer is formed on the surface of the aluminum layer on the side opposite to the ceramic substrate, the titanium layer can function as a diffusion prevention layer. Therefore, the diffusion of aluminum of the aluminum layer to an element mounted on the circuit layer can be prevented.

A thermoelectric conversion module of the present invention includes: a thermoelectric element mounted on the circuit layer of the insulated circuit board described above.

In the thermoelectric conversion module having the above-described configuration, since the thermoelectric element is mounted on the circuit layer in which the titanium layer is formed on the surface of the aluminum layer on the side opposite to the ceramic substrate, the diffusion of aluminum of the aluminum layer to the thermoelectric element is prevented, so that deterioration of the characteristics of the thermoelectric element can be prevented.

Effects of the Invention

According to the present invention, it is possible to provide a method for manufacturing an insulated circuit board capable of accurately and efficiently forming a circuit pattern in a circuit layer including an aluminum layer disposed on one surface of a ceramic substrate and a titanium layer formed on the surface of the aluminum layer on the side opposite to the ceramic substrate, an insulated circuit board, and a thermoelectric conversion module.

EMBODIMENTS FOR CARRYING OUT THE INVENTION

Hereinafter, embodiments of the present invention will be described with reference to the accompanying drawings. In the following description, a "brazing filler material" is not necessarily limited to a material containing lead.

First Embodiment

Figure 1:
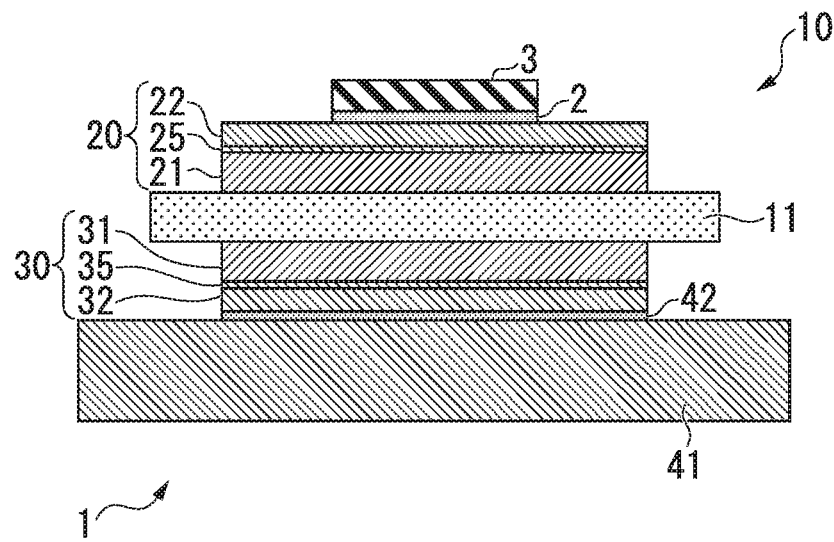
FIG. 1 is a schematic explanatory view of a power module including an insulated circuit board according to a first embodiment of the present invention.

FIG. 1 shows a power module 1 using an insulated circuit board 10 according to a first embodiment of the present invention.

The power module 1 includes the insulated circuit board 10, a semiconductor element 3 joined to one surface (upper surface in FIG. 1) of the insulated circuit board 10 via a first solder layer 2, and a heat sink 41 joined to the lower side of the insulated circuit board 10 via a second solder layer 42.

The semiconductor element 3 includes a semiconductor material such as Si and the like. The first solder layer 2 for joining the insulated circuit board 10 and the semiconductor element 3 together consists of, for example, a Sn—Ag-based, Sn—Cu-based, Sn—In-based, or Sn—Ag—Cu-based solder material (so-called lead-free solder material).

The heat sink 41 is for dissipating heat on the insulated circuit board 10 side. The heat sink 41 consists of copper or a copper alloy, and in this embodiment, the heat sink 41 consists of oxygen-free copper. The second solder layer 42 for joining the insulated circuit board 10 and the heat sink 41 together consists of, for example, a Sn—Ag-based, Sn—Cu-based, Sn—In-based, or Sn—Ag—Cu-based solder material (so-called lead-free solder material).

Figure 2:
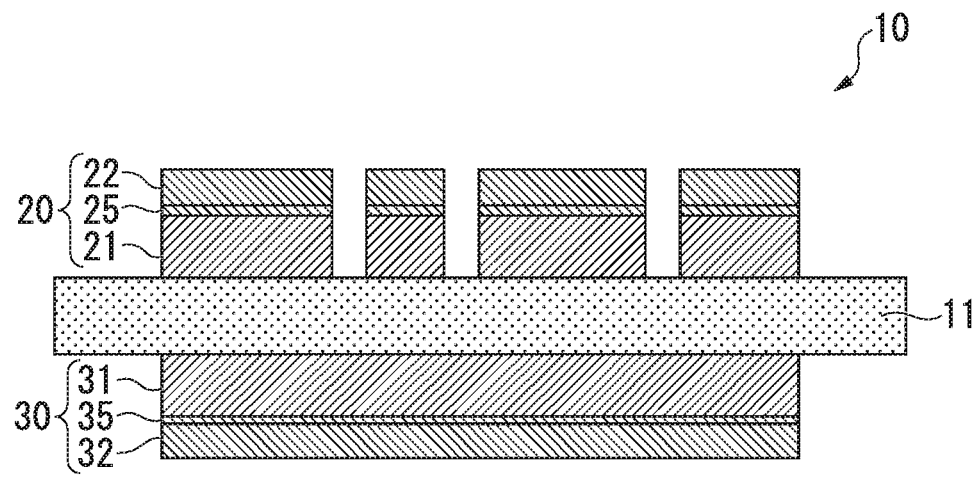
FIG. 2 is an explanatory view of the insulated circuit board according to the first embodiment of the present invention.

In addition, as shown in FIGS. 1 and 2, the insulated circuit board 10 according to this embodiment includes a ceramic substrate 11, a circuit layer 20 disposed on one surface (upper surface in FIGS. 1 and 2) of the ceramic substrate 11, and a metal layer 30 disposed on the other surface (lower surface in FIGS. 1 and 2) of the ceramic substrate 11.

The ceramic substrate 11 consists of highly insulating AlN (aluminum nitride), $Si_3N_4$ (silicon nitride), $Al_2O_3$ (alumina), or the like. In this embodiment, the ceramic substrate 11 consists of $Si_3N_4$ (silicon nitride) having excellent strength. Furthermore, the thickness of the ceramic substrate 11 is set to be in a range of 0.2 to 1.5 mm, and the thickness of the ceramic substrate 11 is set to 0.32 mm in this embodiment.

As shown in FIGS. 1 and 2, the circuit layer 20 includes an aluminum layer 21 disposed on the one surface of the ceramic substrate 11, and a copper layer 22 (metal member layer) laminated on one surface of the aluminum layer 21 via a titanium layer 25.

The thickness of the aluminum layer 21 in the circuit layer 20 is set to be in a range of 0.1 mm or more and 1.0 mm or less, and the thickness of the aluminum layer 21 is set to 0.4 mm in this embodiment.

The thickness of the copper layer 22 in the circuit layer 20 is set to be in a range of 0.1 mm or more and 6.0 mm or less, and the thickness of the copper layer 22 is set to 1.0 mm in this embodiment.

In the circuit layer 20, a circuit pattern is formed as shown in FIG. 2.

As shown in FIGS. 1 and 2, the metal layer 30 includes an aluminum layer 31 disposed on the other surface of the ceramic substrate 11, and a copper layer 32 (metal member layer) laminated on one surface of the aluminum layer 31 via a titanium layer 35.

The thickness of the aluminum layer 31 in the metal layer 30 is set to be in a range of 0.1 mm or more and 3.0 mm or less, and the thickness of the aluminum layer 31 is set to 0.4 mm in this embodiment.

Furthermore, the thickness of the copper layer 32 in the metal layer 30 is set to be in a range of 0.1 mm or more and 6.0 mm or less, and the thickness of the copper layer 32 is set to 1.0 mm in this embodiment.

Figure 5:
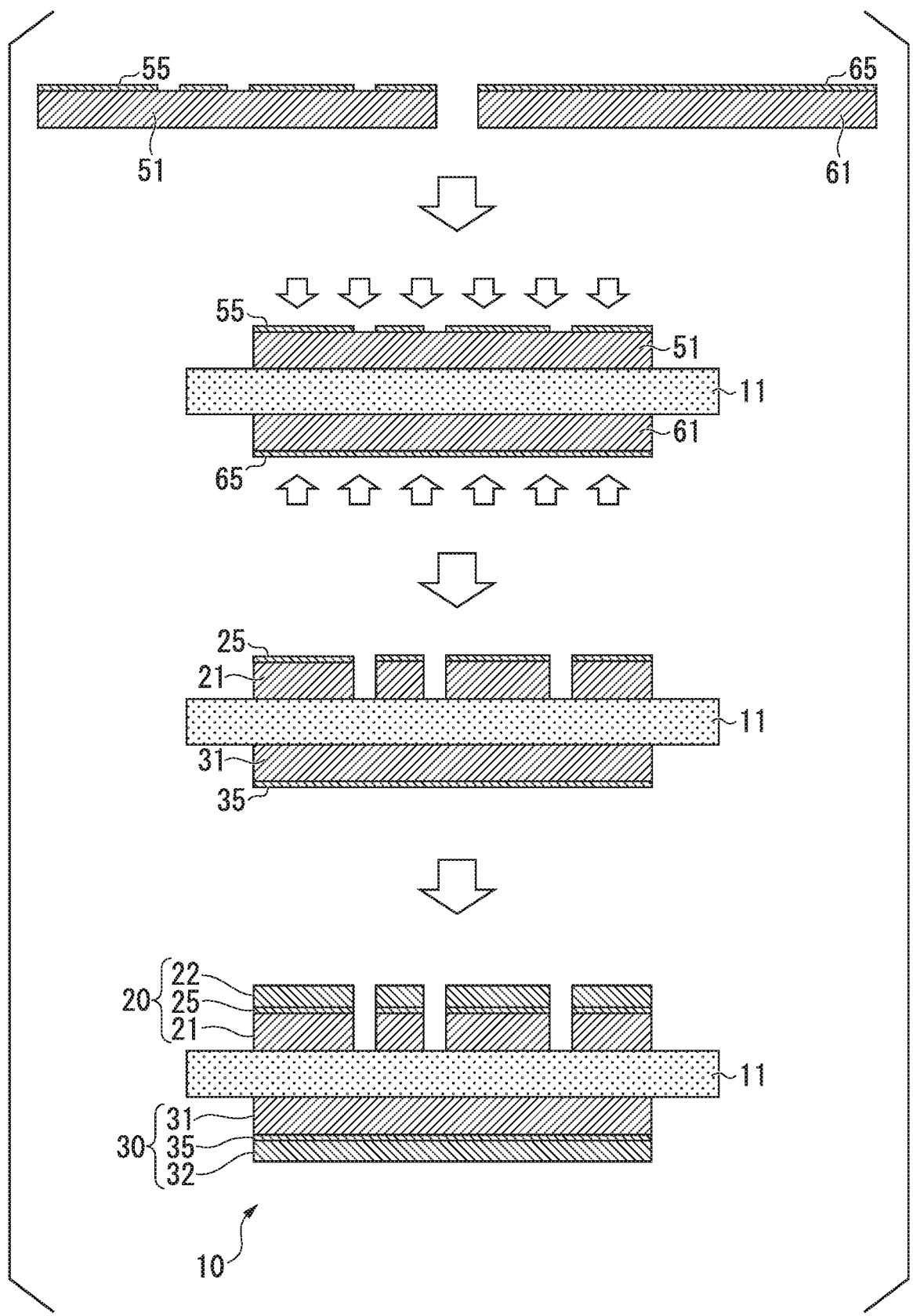
FIG. 5 is a schematic explanatory view of the method for manufacturing the insulated circuit board according to the first embodiment of the present invention.

As shown in FIG. 5, the aluminum layers 21 and 31 are formed by joining aluminum sheets 51 and 61 to the one surface and the other surface of the ceramic substrate 11, respectively.

In addition, the aluminum sheets 51 and 61 which are to become the aluminum layers 21 and 31 consist of aluminum (2N aluminum) having a purity of 99 mass % or more. The amount of Si therein is in a range of 0.03 mass % or more and 1.0 mass % or less.

The copper layers 22 and 32 are formed by joining copper sheets (metal member) consisting of copper or a copper alloy to one surface and the other surface of the aluminum layers 21 and 31 via the titanium layers 25 and 35, respectively. In this embodiment, the copper sheets (metal members) forming the copper layers 22 and 32 are rolled sheets consisting of oxygen-free copper.

Figure 3:
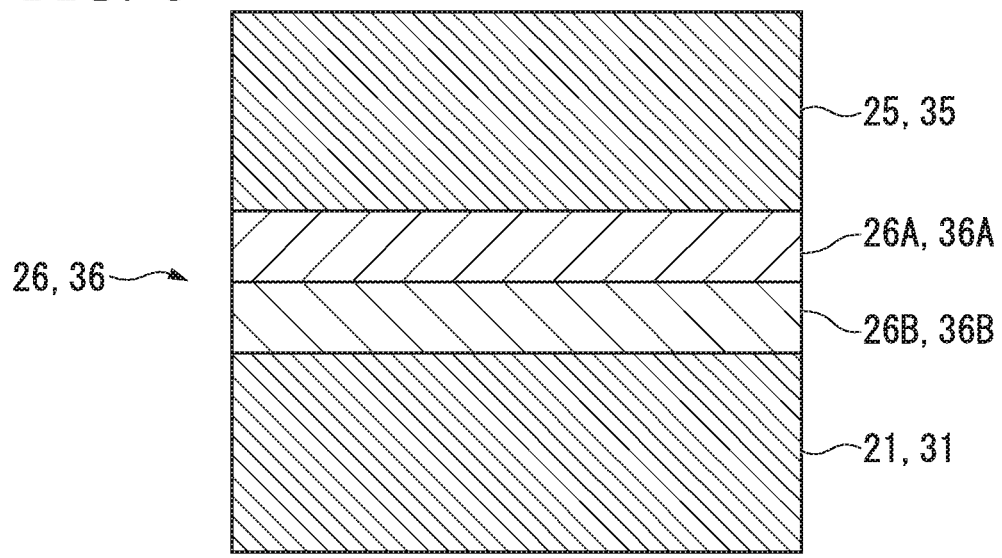
FIG. 3 is an enlarged explanatory view of a joint interface between an aluminum layer and a titanium layer in the insulated circuit board according to the first embodiment of the present invention.

As shown in FIG. 3, Al—Ti—Si layers 26 and 36 are formed at the joint interfaces between the aluminum layers 21 and 31 and the titanium layers 25 and 35, respectively.

$Al_3Ti$ is formed by mutual diffusion of Al atoms of the aluminum layers 21 and 31 and Ti atoms of the titanium layers 25 and 35, and the Al—Ti—Si layers 26 and 36 are formed by solid-solubilizing Si of the aluminum layers 21 and 31 in $Al_3Ti$, respectively.

The thickness of the Al—Ti—Si layers 26 and 36 is set to 0.5 μm or more and 10 μm or less, and the thickness of the Al—Ti—Si layers 26 and 36 is 3 μm in this embodiment.

As shown in FIG. 3, the Al—Ti—Si layers 26 and 36 include first Al—Ti—Si layers 26A and 36A formed on the titanium layers 25 and 35 side and second Al—Ti—Si layers 26B and 36B formed on the aluminum layers 21 and 31 side, respectively. That is, the titanium layers 25 and 35, the first Al—Ti—Si layers 26A and 36A, and the second Al—Ti—Si layers 26B and 36B are formed at the joints between the aluminum layers 21 and 31 and the copper layers 22 and 32, respectively.

As described above, the first Al—Ti—Si layers 26A and 36A and the second Al—Ti—Si layers 26B and 36B consist of Al—Ti—Si phases in which Si is solid-solubilized in $Al_3Ti$, and the Si concentration of the second Al—Ti—Si layers 26B and 36B is lower than the Si concentration of the first Al—Ti—Si layers 26A and 36A, respectively. In this embodiment, Si contained in the first Al—Ti—Si layers 26A and 36A and the second Al—Ti—Si layers 26B and 36B is Si which diffuses into the aluminum layers 21 and 31 and diffuses into the Al—Ti—Si layers 26 and 36, respectively so as to be enriched as will be described later.

The Si concentration of the first Al—Ti—Si layers 26A and 36A is 10 at % or more and 30 at % or less, and the Si concentration of the first Al—Ti—Si layers 26A and 36A is 20 at % in this embodiment. The Si concentration of the second Al—Ti—Si layers 26B and 36B is 1 at % or more and 10 at % or less, and the Si concentration of the second Al—Ti—Si layers 26B and 36B is 3 at % in this embodiment.

Next, a method for manufacturing the insulated circuit board 10 according to this embodiment will be described with reference to FIGS. 4 and 5.

(Titanium Material-Disposing Step S01)

Figure 4:
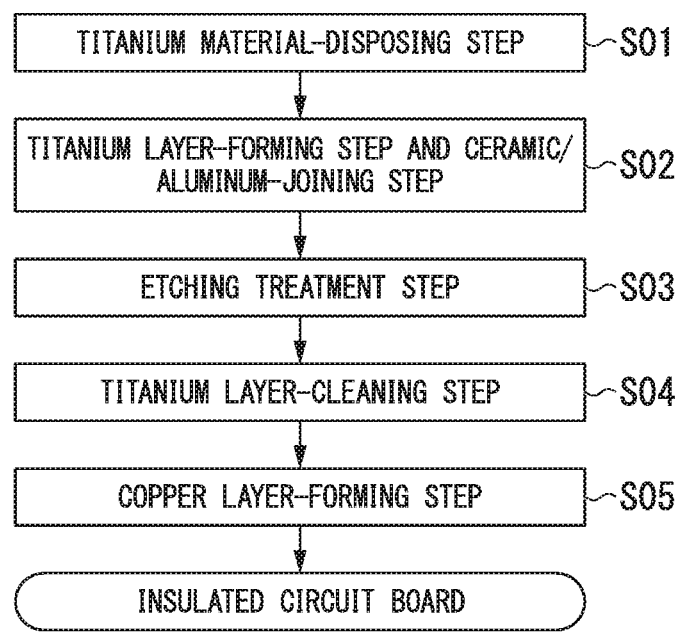
FIG. 4 is a flowchart illustrating a method for manufacturing the insulated circuit board according to the first embodiment of the present invention.

As shown in FIGS. 4 and 5, titanium materials 55 and 65 are disposed on the surfaces of the aluminum sheets 51 and 61, respectively. At this time, the titanium material 55 is disposed in a circuit pattern shape on the surface of the aluminum sheet 51 which is to become the circuit layer 20. When the titanium material 55 is disposed in the circuit pattern shape, a film formation method such as vapor deposition, ion plating, or the like may be applied. In this case, by forming a titanium film using a metal mask, the titanium material 55 can be disposed in the circuit pattern shape. Alternatively, the titanium foil may be disposed in the circuit pattern shape.

In the case where the titanium material 65 is disposed on the surface of the aluminum sheet 61 which is to become the metal layer 30, it is preferable to dispose the titanium foil.

It is preferable that the thickness of the titanium materials 55 and 65 be in a range of 7 μm or more and 20 μm or less.

(Titanium Layer-Forming Step and Ceramic/Aluminum-Joining Step S02)

Next, as shown in FIGS. 4 and 5, the aluminum sheet 51 and the titanium material 55 are disposed on the one surface of the ceramic substrate 11, and the aluminum sheet 61 and the titanium material 65 are disposed on the other surface of the ceramic substrate 11. At this time, an Al—Si brazing filler material is interposed between the aluminum sheet 51 and the ceramic substrate 11, and between the aluminum sheet 61 and the ceramic substrate 11.

In addition, the laminate is disposed in a vacuum heating furnace and heated in a state of being pressurized in the lamination direction (under a load of 3 to 20 kgf/cm² (0.29 to 1.96 MPa)). It is preferable that the pressure in the vacuum heating furnace be set to be in a range of $10^{-6}$ Pa or more and $10^{-3}$ Pa or less, the heating temperature be set to be in a range of 600° C. or higher and 640° C. or lower, and the holding time be set to be in a range of 30 minutes or longer and 180 minutes or shorter.

Accordingly, the aluminum sheet 51 and the ceramic substrate 11 are joined, and the ceramic substrate 11 and the aluminum sheet 61 are joined (ceramic/aluminum-joining step).

In addition, the aluminum sheet 51 and the titanium material 55 are joined and the aluminum sheet 61 and the titanium material 65 are joined; and thereby, the titanium layers 25 and 35 are formed (titanium layer-forming step). At this time, $Al_3Ti$ is formed at the joint interface between the aluminum sheet 51 and the titanium material 55 and at the joint interface between the aluminum sheet 61 and the titanium material 65. Since the aluminum sheets 51 and 61 contain Si in an amount of 0.03 mass % or more and 1.0 mass % or less, Si is solid-solubilized in $Al_3Ti$ so that the Al—Ti—Si layers 26 and 36 described above are formed.

The titanium layer 25 is formed in the circuit pattern shape on the aluminum sheet 51 which is to become the circuit layer 20.

(Etching Treatment Step S03)

Next, as shown in FIGS. 4 and 5, the aluminum layer 21 on which the titanium layer 25 is formed in the circuit pattern shape is subjected to an etching treatment. At this time, ferric chloride is used as the etchant. For example, etching can be performed under conditions where a ferric chloride concentration in the etchant (etching solution) is 35 wt % to 60 wt %, an etching temperature is 40° C. to 60° C., and a time is 2 minutes to 20 minutes.

Since the titanium layer 25 is hardly etched by ferric chloride, the titanium layer 25 acts as a resist material. That is, portions where the titanium layer 25 is formed are not etched, and only portions where the titanium layer 25 is not formed are etched. Accordingly, the aluminum layer 21 is also formed into the circuit pattern shape.

(Titanium Layer-Cleaning Step S04)

Next, as shown in FIG. 4, the surfaces of the titanium layers 25 and 35 on which the copper layers 22 and 32 are to be disposed are cleaned. A mixed solution of ammonia and hydrogen peroxide is used for cleaning the titanium layers 25 and 35. For example, an aqueous solution containing 10 wt % of ammonia, 3 wt % of hydrogen peroxide, and 12 wt % of ethylenediaminetetraacetic acid (EDTA) can be used. Cleaning may be performed at a temperature of 40° C. to 50° C. for 10 minutes to 30 minutes as a cleaning condition.

(Copper Layer-Forming Step S05)

Next, the copper layers 22 and 32 are formed by joining the copper sheets (metal members) on the surfaces of the titanium layers 25 and 35, respectively. At this time, when the titanium layers 25 and 35 and the copper sheets (metal members) are joined, a solid-phase diffusion bonding method may be applied or a brazing filler material may be used for the joining.

For example, in the case of applying the solid-phase diffusion bonding method, the titanium layers 25 and 35 and the copper sheets (metal members) may be laminated, and joining may be conducted in a state of being pressurized in the lamination direction (under a load of 3 to 20 kgf/cm$^2$) under conditions where a pressure in the vacuum heating furnace is in a range of $10^{-6}$ Pa or more and $10^{-3}$ Pa or less and a heating temperature is in a range of 600° C. or higher and 650° C. or lower, and more preferably 620° C. or higher and 643° C. or lower, and a holding time is in a range of 30 minutes or longer and 180 minutes or shorter, and more preferably 60 minutes or longer and 120 minutes or shorter.

In the case of joining using the brazing filler material, a brazing filler material foil such as a Cu—P—Sn brazing filler material, Cu—P—Sn—Ni-based brazing filler material, Cu—P—Sn—Fe-based brazing filler material, Cu—P—Sn—Mn-based brazing filler material, or Cu—P—Sn—Cr-based brazing filler material may be disposed between the titanium layers 25 and 35 and the copper sheets (metal members), and joining may be conducted in a state of being pressured in the lamination direction (under a load of 3 to 20 kgf/cm$^2$) under conditions where a pressure in the vacuum heating furnace is in a range of $10^{-6}$ Pa or more and $10^{-3}$ Pa or less and a heating temperature is in a range of 600° C. or higher and 650° C. or lower, and more preferably 620° C. or higher and 643° C. or lower, and a holding time is in a range of 15 minutes or longer and 120 minutes or shorter, and more preferably 30 minutes or longer and 90 minutes or shorter.

At this time, on the circuit layer 20 side, the copper sheet (metal member) is disposed on and joined to the titanium layer 25 formed in the circuit pattern shape.

Through the above-described steps, the circuit pattern is formed in the circuit layer 20 in which the aluminum layer 21, the titanium layer 25, and the copper layer 22 are laminated; and thereby, the insulated circuit board 10 according to this embodiment is manufactured.

In the method for manufacturing the insulated circuit board 10 according to this embodiment having the above-described configuration, since the titanium material-disposing step S01 of disposing the titanium material 55 which is to become the titanium layer 25 on the surface of the aluminum sheet 51 in the circuit pattern shape is provided, the titanium layer 25 can be formed on the surface of the aluminum layer 21 in the circuit pattern shape by the subsequent titanium layer-forming step and ceramic/aluminum-joining step S02.

Next, since the etching treatment step S03 of performing the etching treatment on the aluminum layer 21 on which the titanium layer 25 is formed is provided, the titanium layer 25 acts as the resist material and the aluminum layer 21 can be etched into the circuit pattern shape. That is, by using the titanium layer 25 as the resist material, an applying step, a curing step, and a peeling step of a resist material can be omitted, and the etching treatment step S03 can be efficiently performed.

In addition, since the copper layer-forming step S05 of forming the copper layer 22 by joining the copper sheet (metal member) on the titanium layer 25 formed in the circuit pattern shape is provided, the copper layer 22 can be formed on the titanium layer 25 in the circuit pattern shape.

Accordingly, the circuit pattern can be accurately and efficiently formed in the circuit layer 20 in which the aluminum layer 21, the titanium layer 25, and the copper layer 22 are laminated.

Furthermore, in this embodiment, since the titanium layer-forming step and ceramic/aluminum-joining step S02 in which the titanium layer-forming step and the ceramic/aluminum-joining step are simultaneously performed is provided, the insulated circuit board 10 having the circuit pattern can be efficiently manufactured.

In addition, in the method for manufacturing the insulated circuit board 10 according to this embodiment, since the titanium layer-cleaning step S04 of cleaning the surface of the titanium layer 25 is provided before the copper layer-forming step S05, the titanium layer 25 and the copper sheet (metal member) can be reliably joined; and thereby, the copper layer 22 can be reliably formed.

Furthermore, in the method for manufacturing the insulated circuit board 10 according to this embodiment, since the aluminum sheets 51 and 61 contain Si in an amount of 0.03 mass % or more and 1.0 mass % or less, Si is solid-solubilized in Al$_3$Ti at the joint interfaces between the titanium layers 25 and 35 and the aluminum layers 21 and 31; and thereby, the Al—Ti—Si layers 26 and 36 described above are formed, respectively. Since the hardness of the Al—Ti—Si layers 26 and 36 is relatively low, the occurrence of cracks in the circuit layer 20 and the metal layer 30 can be prevented when a heat cycle is applied.

Furthermore, the Si concentration of the first Al—Ti—Si layers 26A and 36A formed on the titanium layers 25 and 35 side is higher than the Si concentration of the second Al—Ti—Si layers 26B and 36B formed on the aluminum layers 21 and 31 side, the diffusion of Ti atoms into the aluminum layers 21 and 31 side is prevented by the first Al—Ti—Si layers 26A and 36A having a high Si concentration; and therefore, the thickness of the Al—Ti—Si layers 26 and 36 can be reduced. In addition, by reducing the thickness of the Al—Ti—Si layers 26 and 36 as described above, the occurrence of cracks at the joints between the aluminum layers 21 and 31 and the copper layers 22 and 32 can be prevented when a heat cycle is applied.

In addition, since the concentration of Si contained in the second Al—Ti—Si layers 26B and 36B formed on the aluminum layers 21 and 31 side is 1 at % or more and 10 at % or less, the excessive diffusion of Al atoms toward the titanium layers 25 and 35 side is prevented; and therefore, the thickness of the second Al—Ti—Si layers 26B and 36B can be reduced. The Si concentration of the second Al—Ti—Si layers 26B and 36B is more preferably 1 at % or more and 10 at % or less, but is not limited thereto.

In addition, since the concentration of Si contained in the first Al—Ti—Si layers 26A and 36A formed on the titanium layers 25 and 35 side is 10 at % or more and 30 at % or less, the excessive diffusion of Ti atoms toward the aluminum layers 21 and 31 side is prevented; and therefore, the thickness of the first Al—Ti—Si layers 26A and 36A can be reduced. The Si concentration of the first Al—Ti—Si layers 26A and 36A is more preferably 10 at % or more and 30 at % or less, but is not limited thereto.

Furthermore, in this embodiment, since the copper layers 22 and 32 having relatively high deformation resistance are formed on the surfaces of the circuit layer 20 and the metal layer 30, respectively, when a heat cycle is applied, the deformation of the surfaces of the circuit layer 20 and the metal layer 30 is suppressed, and the occurrence of cracks and the like in the first solder layer 2 for joining the semiconductor element 3 to the circuit layer 20 and the second solder layer 42 for joining the heat sink 41 to the metal layer 30 can be prevented; and thereby, the reliability of the joining can be improved.

In addition, since the copper layers 22 and 32 having good thermal conductivity are formed on the surfaces of the circuit layer 20 and the metal layer 30, respectively, heat from the semiconductor element 3 can spread in a surface direction and heat can be efficiently transferred to the heat sink 41 side.

Second Embodiment

Next, a second embodiment of the present invention will be described. Members having the same configurations as those of the first embodiment are denoted by the same reference numerals, and detailed descriptions thereof will be omitted.

Figure 6:
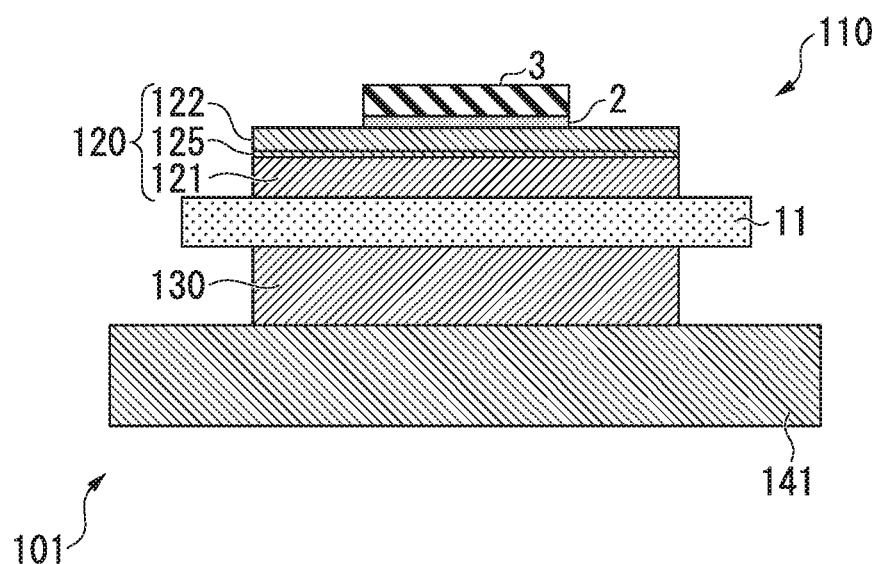
FIG. 6 is a schematic explanatory view of a power module including an insulated circuit board according to a second embodiment of the present invention.

FIG. 6 shows a power module 101 provided with an insulated circuit board 110 according to the second embodiment of the present invention.

The power module 101 includes the insulated circuit board 110, the semiconductor element 3 joined to one surface (upper surface in FIG. 6) of the insulated circuit board 110 via a solder layer 2, and a heat sink 141 joined to the lower side of the insulated circuit board 110.

The heat sink 141 is for dissipating heat on the insulated circuit board 110 side. The heat sink 141 consists of aluminum or an aluminum alloy, and in this embodiment, the heat sink 141 consists of an A6063 alloy. The insulated circuit board 110 and the heat sink 141 are joined together using a brazing filler material.

Figure 7:
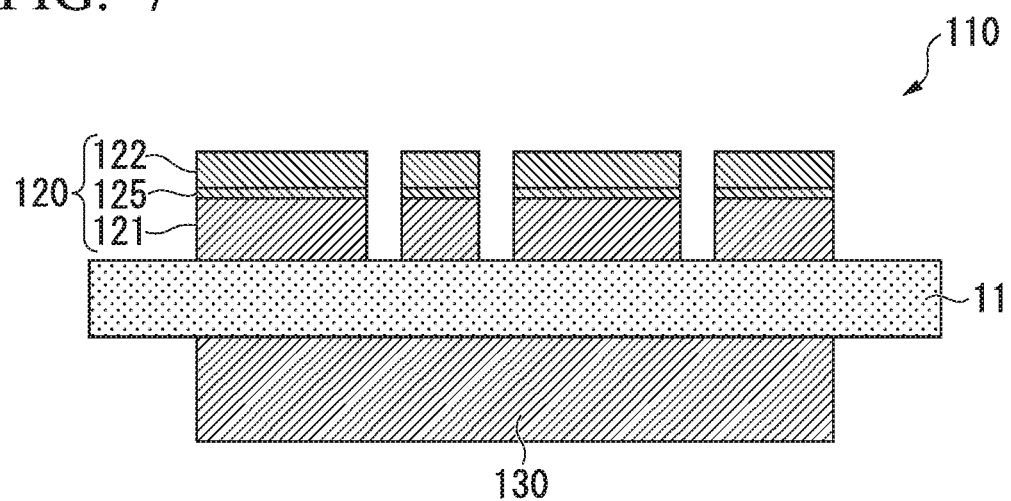
FIG. 7 is an explanatory view of the insulated circuit board according to the second embodiment of the present invention.

As shown in FIGS. 6 and 7, the insulated circuit board 110 includes the ceramic substrate 11, a circuit layer 120 disposed on the one surface of the ceramic substrate 11, and a metal layer 130 disposed on the other surface of the ceramic substrate 11.

As shown in FIGS. 6 and 7, the circuit layer 120 includes an aluminum layer 121 disposed on the one surface of the ceramic substrate 11, and a copper layer 122 (metal member layer) laminated on one surface of the aluminum layer 121 via a titanium layer 125.

The thickness of the aluminum layer 121 in the circuit layer 120 is set to be in a range of 0.1 mm or more and 1.0 mm or less, and the thickness of the aluminum layer 121 is set to 0.6 mm in this embodiment.

The thickness of the copper layer 122 in the circuit layer 120 is set to be in a range of 0.1 mm or more and 6.0 mm or less, and the thickness of the copper layer 122 is set to 1.5 mm in this embodiment.

In the circuit layer 120, a circuit pattern is formed as shown in FIG. 7.

Figure 9:
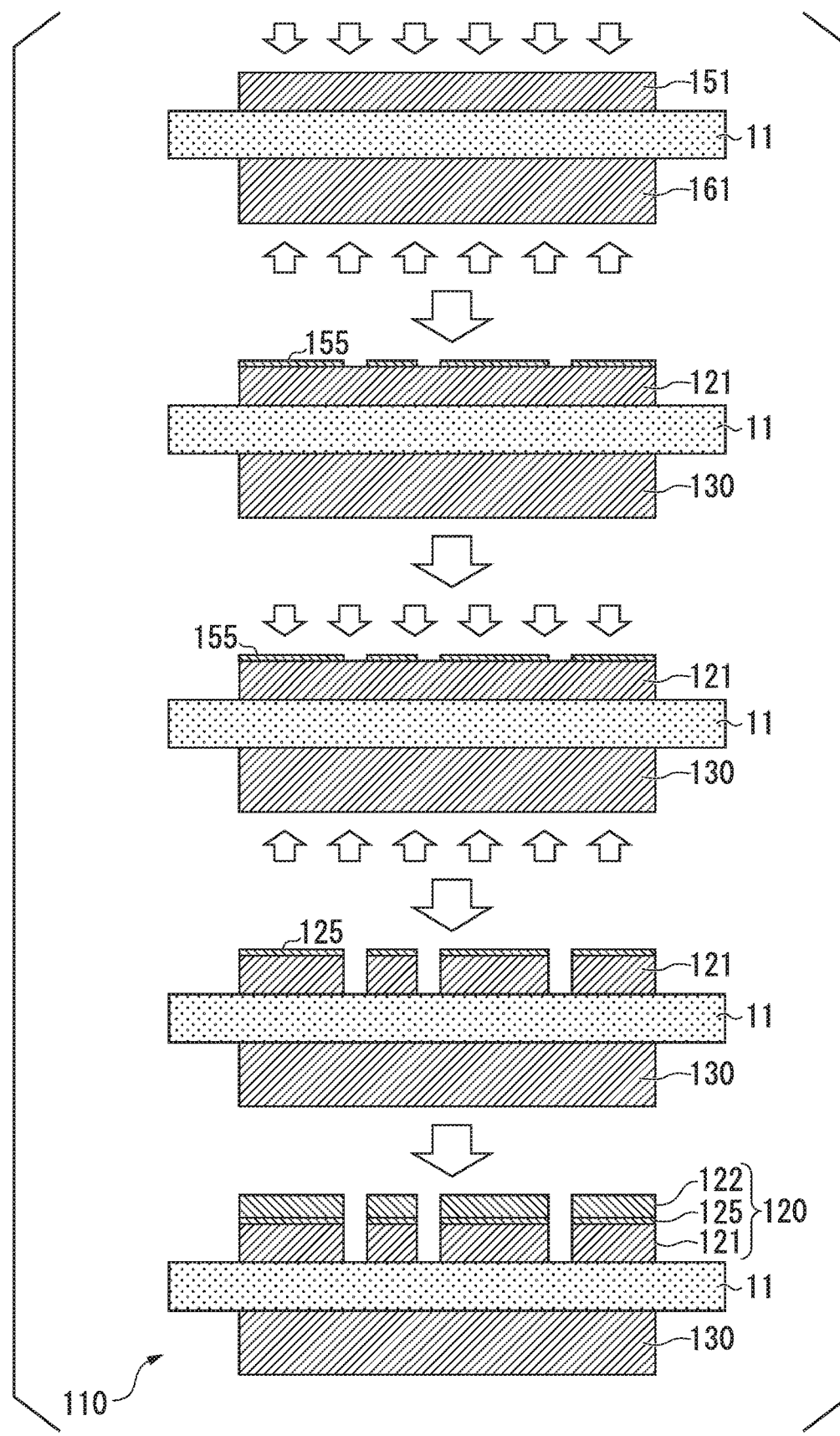
FIG. 9 is a schematic explanatory view of the method for manufacturing the insulated circuit board according to the second embodiment of the present invention.

As shown in FIG. 9, the aluminum layer 121 is formed by joining an aluminum sheet 151 to the one surface of the ceramic substrate 11.

In addition, the aluminum sheet 151 which is to become the aluminum layer 121 consists of aluminum (2N aluminum) having a purity of 99 mass % or more. The amount of Si therein is in a range of 0.03 mass % or more and 1.0 mass % or less.

As shown in FIG. 9, the copper layer 122 is formed by joining a copper sheet (metal member) consisting of copper or a copper alloy to one surface of the aluminum layer 121 via the titanium layer 125. In this embodiment, the copper sheet (metal member) forming the copper layer 122 is a rolled sheet consisting of oxygen-free copper.

At the joint interface between the aluminum layer 121 and the titanium layer 125, as is the case with the first embodiment, an Al—Ti—Si layer in which Si is solid-solubilized in $Al_3Ti$ is formed. $Al_3Ti$ is formed by mutual diffusion of Al atoms of the aluminum layer 121 and Ti atoms of the titanium layer 125, and Si of the aluminum layer 121 is solid-solubilized in the $Al_3Ti$; and thereby, the Al—Ti—Si layer is formed.

As shown in FIG. 9, the metal layer 130 is formed by joining an aluminum sheet 161 to the one surface of the ceramic substrate 11. In this embodiment, the metal layer 130 is formed by joining a rolled sheet of aluminum (4N aluminum) having a purity of 99.99 mass % or more. The thickness of the aluminum sheet 161 to be joined is set to be in a range of 0.1 mm or more and 1.0 mm or less, and the thickness of the aluminum sheet 161 is set to 0.6 mm in this embodiment.

Next, a method for manufacturing the insulated circuit board 110 according to this embodiment will be described with reference to FIGS. 8 and 9.

(Ceramic/Aluminum-Joining Step S101)

Figure 8:
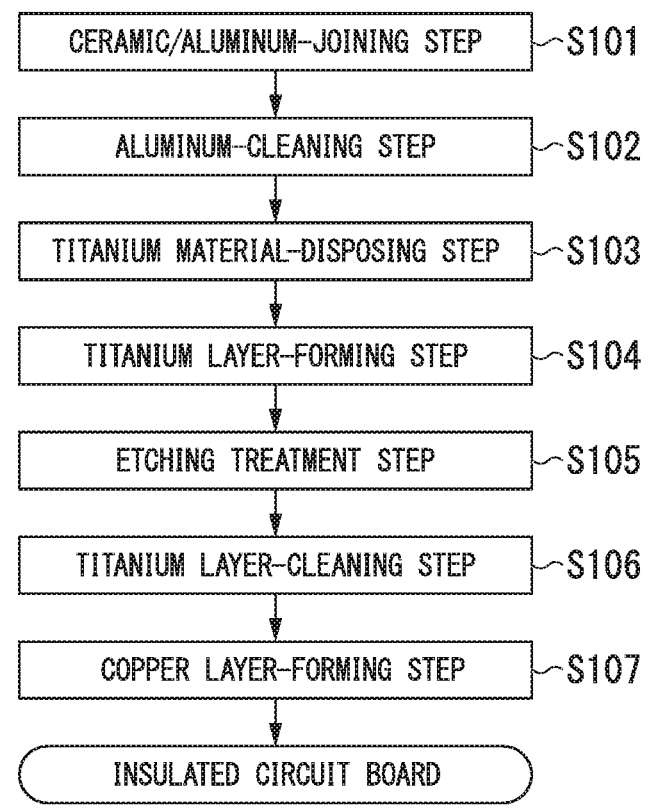
FIG. 8 is a flowchart illustrating a method for manufacturing the insulated circuit board according to the second embodiment of the present invention.

First, as shown in FIGS. 8 and 9, the aluminum sheet 151 is laminated on the one surface of the ceramic substrate 11 via an Al—Si-based brazing filler material foil (not shown). In addition, the aluminum sheet 161 is laminated on the other surface of the ceramic substrate 11 via a brazing filler material foil (not shown).

Next, the aluminum sheet 151, the ceramic substrate 11, and the aluminum sheet 161 which are laminated are disposed in the vacuum heating furnace and heated in a state of being pressurized in the lamination direction (under a load of 3 to 20 $kgf/cm^2$). Accordingly, the aluminum sheet 151 and the ceramic substrate 11 are joined and the ceramic substrate 11 and the aluminum sheet 161 are joined; and thereby, the aluminum layer 121 and the metal layer 130 are formed.

(Aluminum-Cleaning Step S102)

Next, as shown in FIG. 8, the surface of the aluminum layer 121 on the side where a titanium material 155 is to be disposed is cleaned. Cleaning of the aluminum layer 121 can be performed using, for example, an aqueous solution of 5 wt % to 10 wt % of sulfuric acid or an aqueous solution of 5 wt % to 10 wt % of nitric acid at a temperature of 20° C. to 30° C. for 30 seconds to 60 seconds.

(Titanium Material-Disposing Step S103)

Next, as shown in FIGS. 8 and 9, the titanium material 155 is disposed in a circuit pattern shape on the surface of the aluminum layer 121. When the titanium material 155 is disposed in the circuit pattern shape, a film formation method such as vapor deposition, ion plating, or the like may be applied. In this case, by forming a titanium film using a metal mask, the titanium material 155 can be disposed in the circuit pattern shape. Alternatively, the titanium foil may be disposed in the circuit pattern shape.

It is preferable that the thickness of the titanium material 155 be in a range of 7 μm or more and 20 μm or less.

(Titanium Layer-Forming Step S104)

Next, as shown in FIGS. 8 and 9, in a state where the titanium material 155 is disposed on the surface of the aluminum layer 121, the laminate is disposed in the vacuum heating furnace and heated in a state of being pressurized in the lamination direction (under a load of 3 to 20 kgf/cm$^2$). It is preferable that the pressure in the vacuum heating furnace be set to be in a range of $10^{-6}$ Pa or more and $10^{-3}$ Pa or less, the heating temperature be set to be in a range of 600° C. or higher and 640° C. or lower, and the holding time be set to be in a range of 30 minutes or longer and 180 minutes or shorter.

Accordingly, the aluminum layer 121 and the titanium material 155 are joined together, and the titanium layer 125 is formed in the circuit pattern shape. The Al—Ti—Si layer described above is formed at the joint interface between the aluminum layer 121 and the titanium layer 125.

(Etching Treatment Step S105)

Next, as shown in FIGS. 8 and 9, an etching treatment is performed on the aluminum layer 121 on which the titanium layer 125 is formed in the circuit pattern shape. Ferric chloride is used as the etchant. At this time, by allowing the titanium layer 125 to act as a resist film, the aluminum layer 121 is etched into the circuit pattern shape.

(Titanium Layer-Cleaning Step S106)

Next, as shown in FIG. 8, the surface of the titanium layer 125 on which the copper layer 122 is to be disposed is cleaned. The cleaning of the titanium layer 125 can be performed in the same manner as in the first embodiment.

(Copper Layer-Forming Step S107)

Next, the copper layer 122 is formed by joining the copper sheet (metal member) on the surface of the titanium layer 125 formed in the circuit pattern shape. At this time, when the titanium layer 125 and the copper sheet (metal member) are joined, in the same manner as in the first embodiment, a solid-phase diffusion bonding method may be applied or a brazing filler material may be used for the joining.

Through the above-described steps, the circuit pattern is formed in the circuit layer 120 in which the aluminum layer 121, the titanium layer 125, and the copper layer 122 are laminated; and thereby, the insulated circuit board 110 according to this embodiment is manufactured.

In the method for manufacturing the insulated circuit board 110 according to this embodiment having the above-described configuration, as is the case with the first embodiment, since the titanium material-disposing step S103, the titanium layer-forming step S104, the etching treatment step S105, and the copper layer-forming step S107 are provided, the circuit pattern can be accurately and efficiently formed in the circuit layer 120 in which the aluminum layer 121, the titanium layer 125, and the copper layer 122 are laminated.

In addition, in the etching treatment step S105, since the titanium layer 125 is used as the resist material, an applying step and a peeling step of a resist material can be omitted, and the etching treatment step S105 can be efficiently performed.

Third Embodiment

Next, a third embodiment of the present invention will be described. Members having the same configurations as those of the first and second embodiments are denoted by the same reference numerals, and detailed descriptions thereof will be omitted.

Figure 10:
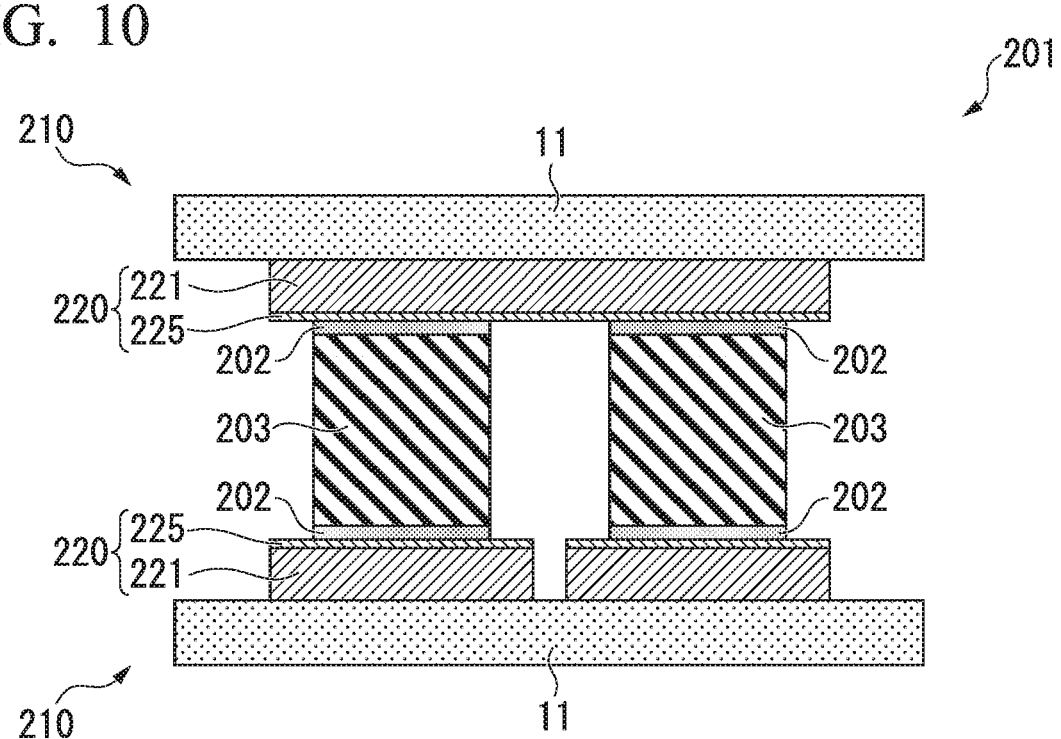
FIG. 10 is a schematic explanatory view of a thermoelectric conversion module including an insulated circuit board according to a third embodiment of the present invention.

FIG. 10 shows a thermoelectric conversion module 201 provided with insulated circuit boards 210 according to the third embodiment of the present invention.

The thermoelectric conversion module 201 includes thermoelectric elements 203 and the insulated circuit boards 210 respectively disposed on one end side and the other end side of the thermoelectric elements 203.

The thermoelectric element 203 is joined to a circuit layer 220 of the insulated circuit board 210 via a joining layer 202. The joining layer 202 is a sintered body of silver paste containing silver particles.

Figure 11:
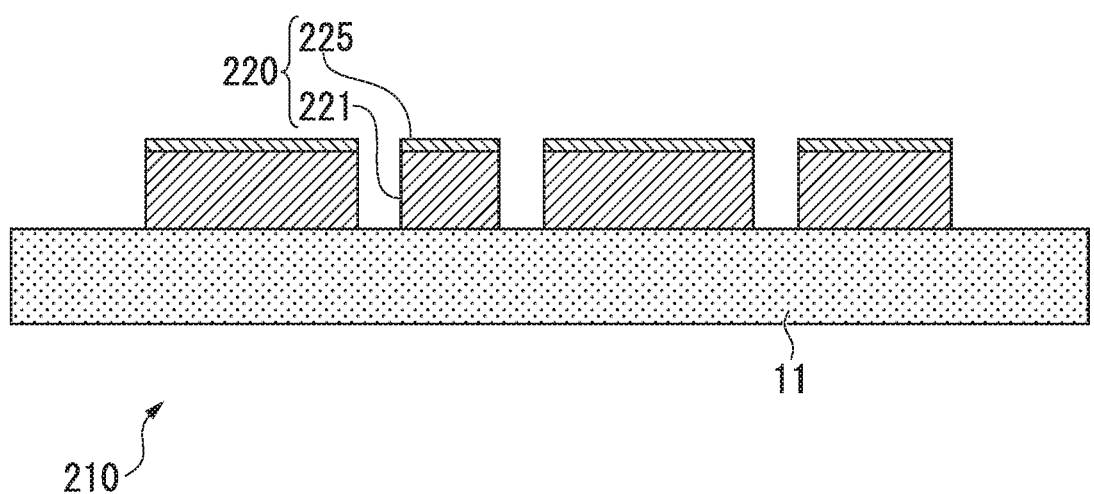
FIG. 11 is an explanatory view of the insulated circuit board according to the third embodiment of the present invention.

As shown in FIGS. 10 and 11, the insulated circuit board 210 includes the ceramic substrate 11, and the circuit layer 220 disposed on the one surface of the ceramic substrate 11.

As shown in FIGS. 10 and 11, the circuit layer 220 includes an aluminum layer 221 disposed on the one surface of the ceramic substrate 11, and a titanium layer 225 formed on one surface of the aluminum layer 221.

The thickness of the aluminum layer 221 in the circuit layer 220 is set to be in a range of 0.1 mm or more and 1.0 mm or less, and the thickness of the aluminum layer 221 is set to 0.6 mm in this embodiment.

In the circuit layer 220, a circuit pattern is formed as shown in FIG. 11.

Figure 13:
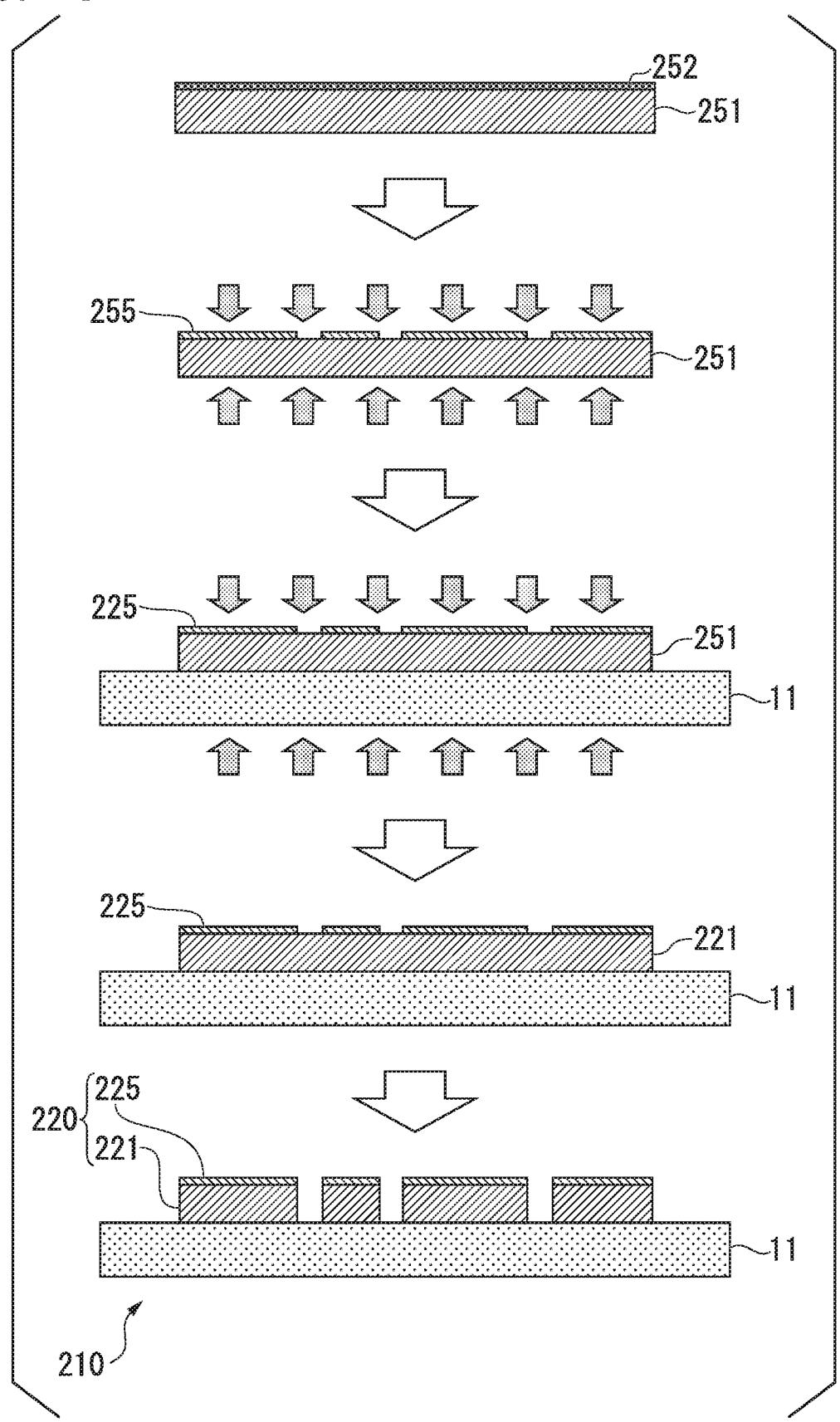
FIG. 13 is a schematic explanatory view of the method for manufacturing the insulated circuit board according to the third embodiment of the present invention.

As shown in FIG. 13, the aluminum layer 221 is formed by joining an aluminum sheet 251 to the one surface of the ceramic substrate 11.

The aluminum sheet 251 which is to become the aluminum layer 221 consists of aluminum (4N aluminum) having a purity of 99.99 mass % or more. At the interface of the aluminum layer 221 on the titanium layer 225 side, a Si-enriched layer in which the amount of Si is in a range of 0.03 mass % or more and 1.0 mass % or less is formed.

At the joint interface between the aluminum layer 221 and the titanium layer 225, as is the case with the first and second embodiments, an Al—Ti—Si layer in which Si is solid-solubilized in Al$_3$Ti is formed. Al$_3$Ti is formed by mutual diffusion of Al atoms of the aluminum layer 221 and Ti atoms of the titanium layer 225, and Si of the Si-enriched layer is solid-solubilized in the Al$_3$Ti; and thereby, the Al—Ti—Si layer is formed.

Next, a method for manufacturing the insulated circuit board 210 according to this embodiment will be described with reference to FIGS. 12 and 13.

(Si-Enriched Layer-Forming Step S201)

First, the Si-enriched layer containing Si in an amount of 0.03 mass % or more and 1.0 mass % or less is formed on one surface of the aluminum sheet 251 consisting of aluminum (4N aluminum) having a purity of 99.99 mass % or more.

Specifically, a Si material 252 (for example, an Al—Si brazing filler material) containing Si is disposed on the one surface of the aluminum sheet 251, and a heating treatment is performed thereon to cause Si of the Si material to diffuse toward the aluminum sheet 251 side; and thereby, the Si-enriched layer mentioned above is formed.

Regarding the Si concentration, five points on the surface on which the titanium layer is to be formed are measured by quantitative analysis using an electron probe microanalyzer (EPMA), and the average value thereof is used. The Si concentration is the concentration when the total amount of Al and Si is taken as 100.

(Titanium Material-Disposing Step S202)

Figure 12:
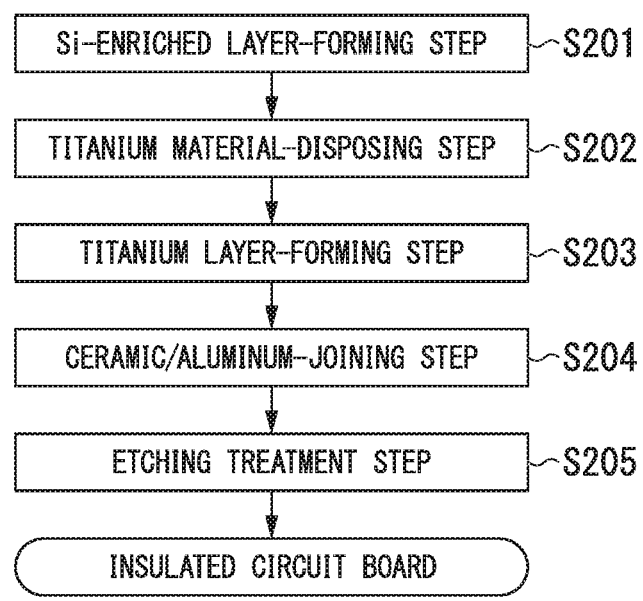
FIG. 12 is a flowchart illustrating a method for manufacturing the insulated circuit board according to the third embodiment of the present invention.

Next, as shown in FIGS. 12 and 13, a titanium material 255 is disposed in a circuit pattern shape on one surface of the aluminum sheet 251 (the surface on which the Si-enriched layer is formed). When the titanium material 255 is disposed in the circuit pattern shape, a film formation method such as vapor deposition, ion plating, or the like may be applied. In this case, by forming a titanium film using a metal mask, the titanium material 255 can be disposed in the circuit pattern shape. Alternatively, the titanium foil may be disposed in the circuit pattern shape.

It is preferable that the thickness of the titanium material 255 be in a range of 7 µm or more and 20 µm or less.

(Titanium Layer-Forming Step S203)

Next, as shown in FIGS. 12 and 13, the titanium material 255 is disposed on the surface of the aluminum sheet 251, and the laminate is disposed in the vacuum heating furnace and heated in a state of being pressurized in the lamination direction (under a load of 3 to 20 kgf/cm$^2$). It is preferable that the pressure in the vacuum heating furnace be set to be in a range of $10^{-6}$ Pa or more and $10^{-3}$ Pa or less, the heating temperature be set to be in a range of 600° C. or higher and 640° C. or lower, and the holding time be set to be in a range of 30 minutes or longer and 180 minutes or shorter.

Accordingly, the aluminum sheet 251 and the titanium material 255 are joined together, and the titanium layer 225 is formed in the circuit pattern shape. The Al—Ti—Si layer described above is formed at the joint interface between the aluminum sheet 251 and the titanium layer 225.

(Ceramic/Aluminum-Joining Step S204)

Next, as shown in FIGS. 12 and 13, the aluminum sheet 251 on which the titanium layer 225 is formed is laminated on the one surface of the ceramic substrate 11 via an Al—Si-based brazing filler material foil (not shown).

Next, the aluminum sheet 251 and the ceramic substrate 11 which are laminated are disposed in the vacuum heating furnace and heated in a state of being pressurized in the lamination direction (under a load of 3 to 20 kgf/cm$^2$).

Accordingly, the aluminum sheet 251 and the ceramic substrate 11 are joined, and the aluminum layer 221 is formed.

(Etching Treatment Step S205)

Next, as shown in FIGS. 12 and 13, an etching treatment is performed on the aluminum layer 221 on which the titanium layer 225 is formed in the circuit pattern shape. Ferric chloride is used as the etchant. At this time, by allowing the titanium layer 225 to act as a resist film, the aluminum layer 221 is etched into the circuit pattern shape.

Through the above-described steps, the circuit pattern is formed in the circuit layer 220 in which the aluminum layer 221 and the titanium layer 225 are laminated; and thereby, the insulated circuit board 210 according to this embodiment is manufactured.

Then, the insulated circuit boards 210 are laminated on the one end side and the other end side of the thermoelectric element 203 via the silver paste so that the circuit layers 220 face the thermoelectric element 203 side, and the laminate is heated to join the insulated circuit boards 210 respectively to the one end side and the other end side of the thermoelectric element 203. Accordingly, the thermoelectric conversion module 201 shown in FIG. 10 is manufactured.

In the method for manufacturing the insulated circuit board 210 according to this embodiment having the above-described configuration, since the titanium material-disposing step S202, the titanium layer-forming step S203, and the etching treatment step S205 are provided, the circuit pattern can be accurately and efficiently formed in the circuit layer 220 in which the aluminum layer 221 and the titanium layer 225 are laminated. In addition, in the etching treatment step S205, since the titanium layer 225 is used as the resist material, an applying step and a peeling step of a resist material can be omitted, and the etching treatment step S205 can be efficiently performed.

Furthermore, in this embodiment, the Si-enriched layer-forming step S201 is provided, and in the Si-enriched layer-forming step S201, the Si-enriched layer containing Si in an amount of 0.03 mass % or more and 1.0 mass % or less is formed on the surface of the aluminum sheet 251 on the side on which the titanium layer 225 is to be formed, and the aluminum sheet 251 consists of aluminum (4N aluminum) having a purity of 99.99 mass % or more. Therefore, even in the case where the aluminum layer 221 of the circuit layer 220 consists of aluminum (4N aluminum) having a purity of 99.99 mass % or more, it is possible to form the Al—Ti—Si layer between the aluminum layer 221 and the titanium layer 225 as is the case with the first and second embodiments.

In addition, in the insulated circuit board 210 and the thermoelectric conversion module 201 according to this embodiment, since the titanium layer 225 is formed on the surface of the aluminum layer 221 on the side opposite to the ceramic substrate 11, the titanium layer 225 can function as a diffusion prevention layer. Therefore, it is possible to prevent the diffusion of aluminum of the aluminum layer 221 to the thermoelectric element 203 mounted on the circuit layer 220. Accordingly, the deterioration of the characteristics of the thermoelectric element 203 can be prevented.

While the embodiments of the present invention have been described above, the present invention is not limited thereto, and can be appropriately changed without departing from the technical features of the invention.

For example, in the embodiments, the case where the aluminum layer and the copper layer consisting of copper as the metal member layer are joined together has been described. However, instead of the copper layer, a nickel layer consisting of nickel or a nickel alloy or a silver layer consisting of silver or a silver alloy may be joined.

In the case where the nickel layer is formed instead of the copper layer, the solderability is improved, and the reliability of joining the semiconductor element or the heat sink can be improved. Furthermore, in the case of forming the nickel layer by solid-phase diffusion bonding, it is unnecessary to perform a masking treatment which is performed when a Ni plating film is formed by electroless plating or the like; and thereby, the manufacturing cost can be reduced. In this case, it is desirable that the thickness of the nickel layer be 1 µm or more and 30 µm or less. In the case where the thickness of the nickel layer is less than 1 µm, there is a concern that the effect of improving the reliability of joining the semiconductor element or the heat sink may be lost, and in the case where the thickness of the nickel layer is more than 30 µm, the nickel layer acts as a thermal resistor, and there is a concern that heat may not be efficiently transferred. In addition, in the case of forming the nickel layer by solid-phase diffusion bonding, the nickel layer can be formed by the solid-phase diffusion bonding under the same conditions as those in the case of forming the copper layer.

In the case where the silver layer is formed instead of the copper layer, for example, when the semiconductor element or the heat sink is joined using a silver oxide paste containing silver oxide particles and a reducing agent consisting of an organic material, silver to which the silver oxide is reduced and the silver layer are connected, that is, metals of the same kind are joined together. Therefore, the joining reliability can be improved. In addition, since the silver layer having good thermal conductivity is formed, heat can spread in the surface direction and heat can be efficiently transferred. In this case, it is desirable that the thickness of the silver layer be 1 µm or more and 20 µm or less. In the case where the thickness of the silver layer is less than 1 µm, there is a concern that the effect of improving the reliability of joining to the semiconductor element or the heat sink may be lost, and in the case where the thickness of the silver layer is more than 20 µm, the effect of improving the joining reliability cannot be seen, and the cost increases. In addition, in the case of forming the silver layer by solid-phase diffusion bonding, the silver layer can be formed by the solid-phase diffusion bonding under the same conditions as those in the case of forming the copper layer.

In the first and second embodiments, as the aluminum sheet which is to become the aluminum layer, an aluminum sheet which is 2N aluminum having a purity of 99 mass % or more and containing Si in an amount of 0.03 mass % or more and 1.0 mass % or less is exemplified. However, the aluminum sheet is not limited thereto, and another aluminum material may be used.

In the case of using an aluminum material that does not contain Si, such as 4N aluminum having a purity of 99.99 mass % or more, as described in the third embodiment, the Si concentration of the surface of the aluminum material on which the titanium layer is to be formed may be adjusted to 0.03 mass % to 1.0 mass % in advance. Regarding the Si concentration, five points on the surface on which the titanium layer is to be formed are measured by quantitative analysis using the EPMA, and the average value thereof is used. The Si concentration is the concentration when the total amount of Al and Si is taken as 100.

INDUSTRIAL APPLICABILITY

In the method for manufacturing the insulated circuit board according to the present invention, a circuit pattern can be accurately and efficiently formed in a circuit layer. In addition, the insulated circuit board of the present invention is suitable for a semiconductor device such as an LED, a power module, or the like, and a thermoelectric conversion module.

EXPLANATION OF REFERENCE SIGNS 10, 110, 210: insulated circuit board
11: ceramic substrate
20, 120, 220: circuit layer
30, 130: metal layer
21, 121, 221: aluminum layer
22, 122: copper layer (metal member layer)
51, 151, 251: aluminum sheet (aluminum material)
25, 125, 225: titanium layer
55, 155, 255: titanium material
201: thermoelectric conversion module
203: thermoelectric element

The invention claimed is:

1. A method for manufacturing an insulated circuit board including a ceramic substrate and a circuit layer having a circuit pattern disposed on one surface of the ceramic substrate,
    wherein the circuit layer includes an aluminum layer disposed on the one surface of the ceramic substrate, and a titanium layer formed on a surface of the aluminum layer on a side opposite to the ceramic substrate, and
    the method comprises:
    a ceramic/aluminum-joining step of joining an aluminum material to the ceramic substrate and thereby, forming the aluminum layer;
    a titanium material-disposing step of disposing a titanium material, which is to become the titanium layer, on a surface of the aluminum layer or the aluminum material in the circuit pattern shape;
    a titanium layer-forming step of performing a heat treatment in a state where the titanium material is laminated on the surface of the aluminum layer or the aluminum material and thereby, forming the titanium layer;
    an etching treatment step of etching the aluminum layer on which the titanium layer is formed, into the circuit pattern shape; and
    the method further comprises a Si-enriched layer-forming step of forming a Si-enriched layer containing Si in an amount of 0.03 mass % or more and 1.0 mass % or less on the surface of the aluminum layer or the aluminum material on which the titanium layer is to be formed, before the titanium material-disposing step.

2. The method for manufacturing an insulated circuit board according to claim 1,
    wherein the circuit layer includes a metal member layer consisting of copper, a copper alloy, nickel, a nickel alloy, silver, or a silver alloy laminated on a surface of the titanium layer on a side opposite to the aluminum layer, and
    the method further comprises a metal member layer-forming step of forming the metal member layer on the surface of the titanium layer formed into the circuit pattern shape after the etching treatment step.

3. The method for manufacturing an insulated circuit board according to claim 2,
    wherein the titanium material-disposing step and the titanium layer-forming step are performed after the ceramic/aluminum-joining step.

4. The method for manufacturing an insulated circuit board according to claim 2,
    wherein the ceramic/aluminum-joining step is performed after the titanium layer-forming step.

5. The method for manufacturing an insulated circuit board according to claim 2,
    wherein the titanium layer-forming step and the ceramic/aluminum-joining step are simultaneously performed.

6. The method for manufacturing an insulated circuit board according to claim 2, further comprising:
    an aluminum-cleaning step of cleaning the surface of the aluminum layer or the aluminum material before the titanium material-disposing step.

7. The method for manufacturing an insulated circuit board according to claim 2, further comprising:
    a titanium layer-cleaning step of cleaning the surface of the titanium layer before the metal member layer-forming step.

8. The method for manufacturing an insulated circuit board according to claim 7 wherein the titanium material-disposing step and the titanium layer-forming step are performed after the ceramic/aluminum-joining step.

9. The method for manufacturing an insulated circuit board according to claim 7,
wherein the ceramic/aluminum-joining step is performed after the titanium layer-forming step.

10. The method for manufacturing an insulated circuit board according to claim 7,
wherein the titanium layer-forming step and the ceramic/aluminum-joining step are simultaneously performed.

11. The method for manufacturing an insulated circuit board according to claim 7, further comprising:
an aluminum-cleaning step of cleaning the surface of the aluminum layer or the aluminum material before the titanium material-disposing step.

12. The method for manufacturing an insulated circuit board according to claim 1,
wherein the titanium material-disposing step and the titanium layer-forming step are performed after the ceramic/aluminum-joining step.

13. The method for manufacturing an insulated circuit board according to claim 1,
wherein the ceramic/aluminum-joining step is performed after the titanium layer-forming step.

14. The method for manufacturing an insulated circuit board according to claim 1,
wherein the titanium layer-forming step and the ceramic/aluminum-joining step are simultaneously performed.

15. The method for manufacturing an insulated circuit board according to claim 1, further comprising:
an aluminum-cleaning step of cleaning the surface of the aluminum layer or the aluminum material before the titanium material-disposing step.

* * * * *